United States Patent [19]

Whelan

[11] 4,299,518
[45] Nov. 10, 1981

[54] MANUFACTURING WORK STATION

[75] Inventor: Paul L. Whelan, Dallas, Tex.

[73] Assignee: Texas Instruments Incorporated, Dallas, Tex.

[21] Appl. No.: 126,226

[22] Filed: Mar. 3, 1980

[51] Int. Cl.³ .............................................. B65G 51/02
[52] U.S. Cl. ....................................... 406/62; 406/88
[58] Field of Search ...................... 406/19, 21, 28, 52, 406/63, 62, 85, 88, 72; 414/217, 222; 118/62, 715, 719, 728, 730, 729, 732, 733

[56] References Cited

U.S. PATENT DOCUMENTS 3,718,371  2/1973  Lasch, Jr. ............................. 406/88
3,765,763 10/1973  Nygaard ........................... 118/719 X Primary Examiner—Jeffrey V. Nase
Attorney, Agent, or Firm—Rene' E. Crossman; Melvin Sharp; James T. Comfort

[57] ABSTRACT

Disclosed for use in a line for manufacturing an article is a manufacturing work station which operates at subatmospheric conditions. The work station comprises a housing which includes a base plate having a recess at least as large as the article to be manufactured. The recess has a plurality of grooves formed in it. A spacer plate overlies the recess and has an aperture over each of the grooves in the base. A track insert plate generally of the same configuration as the spacer plate overlies said spacer plate and has a plurality of grooves therein which overlie each of said spacer apertures. A plurality of slanted holes are formed through the track insert plate and connect to the grooves in the track insert plate whereby when gas is applied through selected base plate grooves, the gas is transmitted through the slanted holes to move the article in the work station.

10 Claims, 8 Drawing Figures

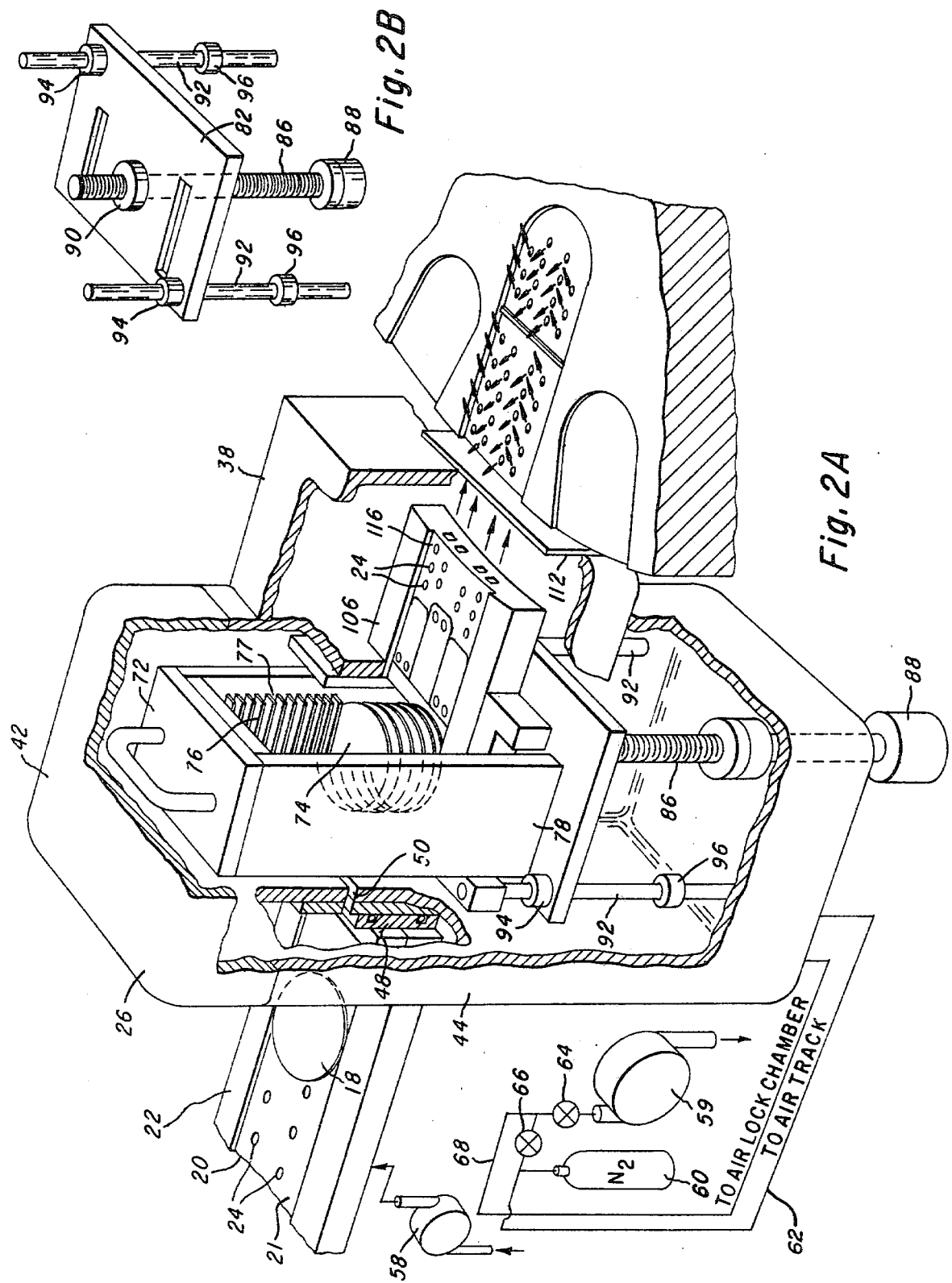

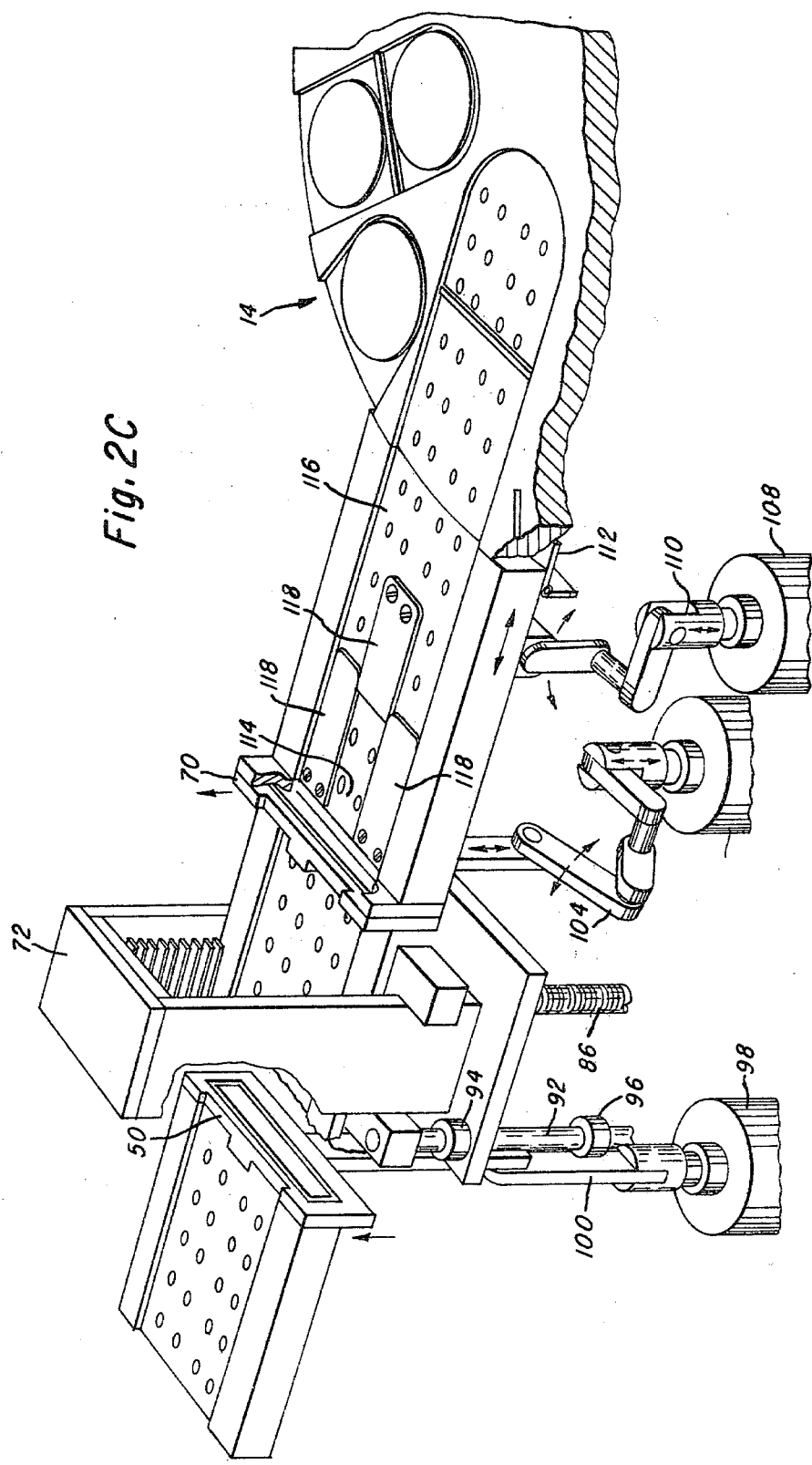

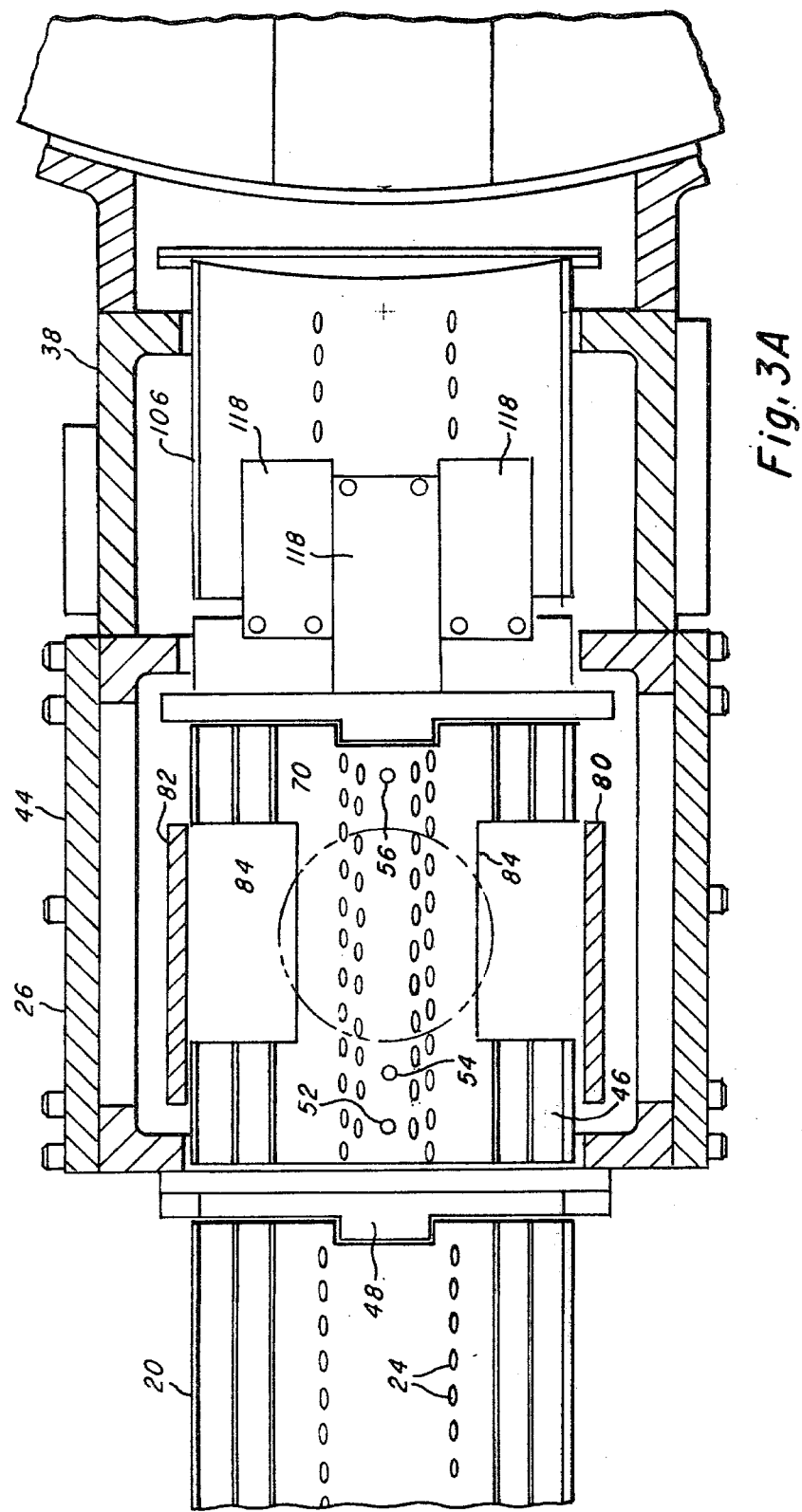

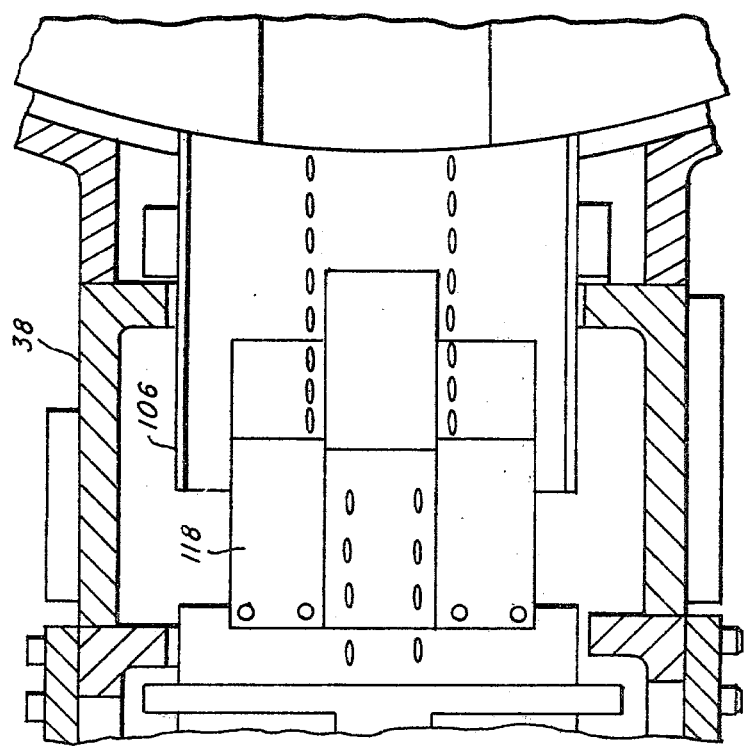

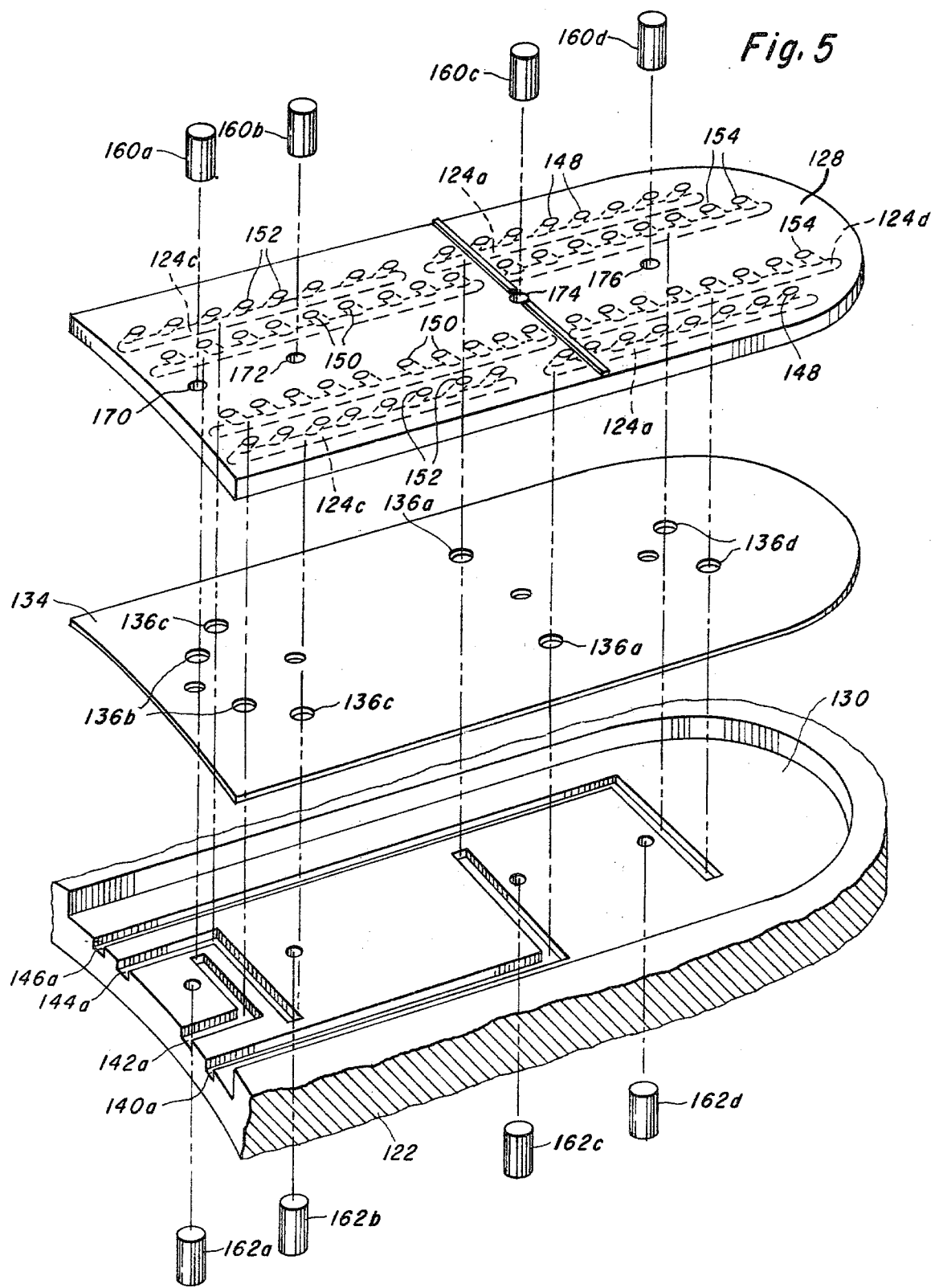

MANUFACTURING WORK STATION

This invention relates to a manufacturing work station and more particularly to a processing station for receiving on a gas transfer system one or more articles for processing.

In manufacturing electronic components, semiconductor products (slices) are transported in a serial fashion between a plurality of work stations. As the slices move through the manufacturing line, each work station performs a separate manufacturing operation on each slice in order to attempt to process the slices rapidly and to prevent slice accumulation between work stations. Typical of such systems is the automatic slice processing system described in U.S. Pat. No. 3,765,763 entitled Automatic Slice Processing. This system operates at atmospheric conditions and the slices are conveyed on a cushion of compressed gas or air, hereinafter referred to as an "air" track system (regardless of the particular gas that is used to convey the slices). The slices to be transported are extremely thin and fragile, each slice being approximately one to four inches in diameter and approximately 20 mils in thickness. In addition to being very thin and easily broken, each semiconductor slice must be carefully handled to ensure that all but the edges of the major surfaces of the slices remain undamaged during device fabrication. The slice surfaces must also remain clean throughout the fabrication of the individual devices. Some mechanical equipment has been devised to store and transport semiconductor slices such as that disclosed in U.S. Pat. No. 3,507,382 entitled Semiconductor Slice Storage and Conveyor System. However mechanical transport systems create particle contamination in the processing stage through friction of the parts which is undesirable.

Present semiconductor processing requires manufacturing operations which occur at subatmospheric pressures, some less than 1.0 torr ((1.0 torr=1.0 mm mercury=0.019 PSI). One such manufacturing operation utilizes plasma reactors which provide reactive plasma deposition and etching of high quality dielectric films on semiconductor substrates during the manufacturing of such semiconductor slices. These plasma reactor systems are capable of operating at such subatmospheric pressures (less than 1.0 torr, for example) and at temperatures above 300 C. However, using such a plasma reactor system at subatmospheric pressures in a manufacturing system (such as that disclosed in U.S. Pat. No. 3,765,763 referenced above) creates a problem in that the manufacturing system described can transport a workpiece or slice and perform a manufacturing operation only at atmospheric pressure. Therefore, to utilize a plasma reactor system as one of the work stations would require bringing the plasma reactor work station to atmospheric pressure. An operator would then use manual techniques, such as gripping the slices with tweezers (which frequently results in a broken slice) or utilizing a vacuum pencil or other vacuum device which must contact the working portion of the slice surface (which also causes surface damage) to load the inner chamber of the plasma reactor work station. Such manual loading of the reactor work station creates problems and disadvantages. One such disadvantage, as mentioned previously, is damage to the slice itself; such manual handling also is slow and therefore reduces the throughput of the manufacturing line. Another factor which reduces the throughput of the manufacturing line is that the plasma reactor system must be brought to atmospheric pressure, opened, loaded, evacuated back to a subatmospheric pressure and then brought back to atmospheric in order to unload. This cycling of the pressure from the reactor's subatmospheric pressure back to atmospheric and then back to subatmospheric pressure in order to process the slices again takes a substantial amount of time, thereby reducing the slice throughput through the manufacturing line. Additionally, when bringing the reactor chamber back to atmospheric pressure in order to manually load the chamber and exposing it to the atmosphere, contaminants are introduced into the plasma reactor chamber which affect the manufacturing operation of the semiconductor slice. Therefore it is desirable to design a system wherein the work station or plasma reactor chamber is never exposed to atmospheric pressure. ET Systems manufactures a Model 4200 Plasma Reactor System which includes a plasma reactor system in combination with an air lock. A mechanical slice transport pivot arm, pivoting inside the air lock, loads and unloads the reactor, one slice at a time. LFE Inc. produces a Model 8000 Plasma Reactor which utilizes an air lock and loads and unloads the reactor with a linear vibrator. Other work stations, such as the AMT Model AVD, utilize an air lock in conjunction with a gravity and shaker feed. These systems all have the disadvantage of loading slices one at a time and the mechanical transport systems create particle contamination in the processing stage.

Heretofore designers veered away from an air track-type system for transporting articles at subatmospheric pressure to different manufacturing processing stations. Designers were not aware that an air track could be used in an environment at extremely low pressures, such as below 10 torr pressure. Also, in a low pressure environment, once the work piece or slice begins moving, it has a tendency to accelerate and therefore is difficult to control. Another problem created by working in a subatmospheric environment is devising a means for stopping the article. At very low pressures, a vacuum brake, such as that described in U.S. Pat. Nos. 3,717,381; 3,976,329; 3,797,889 and 3,890,508 would be ineffective to stop the work piece movement.

Therefore, it is an object of the present invention to provide a manufacturing work station for transporting articles continuously and automatically therethrough without manual intervention.

Another object of the present invention is to provide a manufacturing work station for processing articles at subatmospheric pressures without exposing said station to atmospheric pressures.

Another object of the present invention is to provide an apparatus for transferring articles into and out of a subatmospheric manufacturing processing station while obtaining controlled placement and positioning of the article in such station.

Other objects and features of the invention will become more readily understood from the following detailed description and appended claims when read in conjunction with the accompanying drawings, in which like reference numerals designate like parts throughout the figures thereof, and in which:

FIG. 2A is a cutaway perspective view of an air lock and interim chamber.

FIG. 2B is a perspective view of the support plate and drive mechanism for the magazine loader utilized in the air lock.

FIG. 2C is a perspective view of the air lock and interim chamber with the slidable air track in its extended position.

FIG. 3A is a plan view of the air lock and interim chamber with the magazine loader excluded and the slidable air track in the retracted position.

FIG. 3B is a plan view of the slidable air track in its extended position.

FIG. 5 is an expanded view of the substrate holder table.

Figure 1:
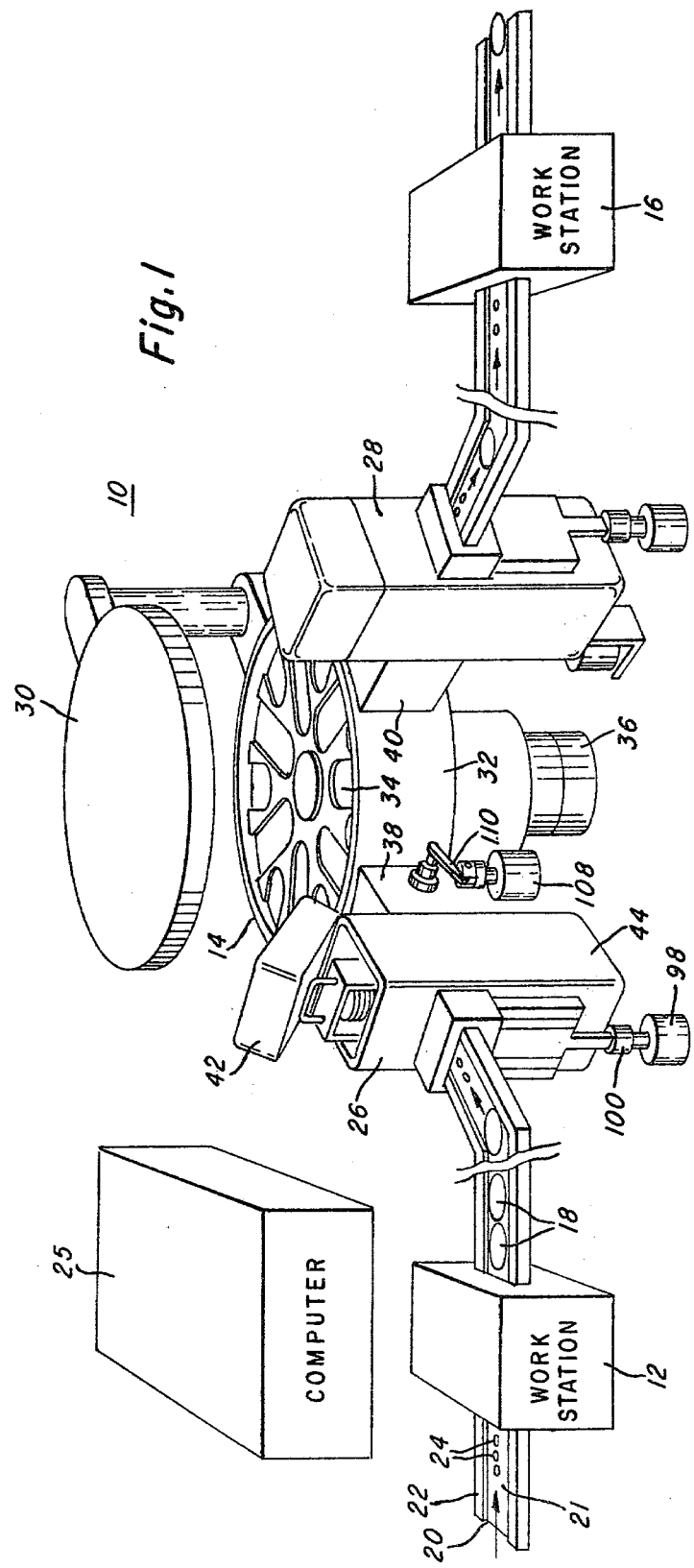
FIG. 1 is a perspective view of a material handling system according to the present invention.

Referring now to FIG. 1, a manufacturing line 10 is disclosed according to the present invention. The manufacturing line 10 is comprised of a plurality of independent work stations 12, 14, 16, each of which is interconnected in a serial manner by a transporting system. Any article which is to be subjected to multiple manufacturing steps and subatmospheric conditions can utilize the present invention, but for purposes of illustration, the invention will be described for use in manufacturing semiconductor products or slices 18. Slices 18 are transported by a slice transporting air (or gas) track 20 which basically is comprised of a guideway 22 having a line of small diameter, angularly directed holes 24 formed in floor member 21. A compressed gas (air) source (not shown) forces compressed air through holes 24 in floor member 21 to form jets of compressed air above the surface of the guideway. The jets support slices 18 on a cushion of air and propel the slices along the guideway throughout the manufacturing line. A conventional air track transport system is disclosed in U.S. Pat. No. 3,717,381.

Computer 25 is connected to the slice transporting portion of the system and operates to regulate movement of slices to and from each of the work stations of the system. The work stations in the system are mechanically, electrically and chemically self contained. The timing, sequencing and control systems which are performed by the computer regulate the initiation, progress and termination of every operation performed by each of the work stations in the system. The computer can be reprogrammed easily such that the manufacturing processes performed by the manufacturing line can be conveniently altered. A computer suitable for use in the present invention is a model TI990 computer manufactured and sold by Texas Instruments Incorporated, Dallas, Tex.

Work station 14 operates at subatmospheric pressures and for purposes of illustration is shown as a plasma reactor work station. Plasma reactors perform reactive plasma deposition and etching of high quality dielectric films on semiconductor substrates during the manufacture thereof. These plasma reactors operate at pressures less than one torr and at temperatures as high as 300° C. Accordingly, a wide variation of temperatures and subatmosphere pressures can be achieved in plasma reactor 14.

Plasma reactor work station 14 is comprised of two separate sections, an upper reactor lid 30 and a lower reactor section 32. Inside lower section 32 is a substrate holder 34 configured so as to hold a maximum of 21 semiconductor slices for processing. Coupled (not shown) to lower reactor section 32 is a drive shaft which is connected to motor 36. Motor 36 rotates 360° in order to load and unload slices into and out substrate holder 34. An entrance interim chamber 38 is configured between the storage means or entrance air lock 26 and the lower section 32 of reactor work station 14. Internal to interim chamber 38 is a slide member which couples the air track system 20 in entrance air lock 26 with the substrate holder 34; this is described and shown more clearly in FIG. 2A.

In operation, the series of slices 18 are transported along air track 20 to work station 12. At least one or more manufacturing steps is performed at atmospheric pressure on these semiconductor slices 18 at work station 12. Upon completion of the manufacturing step on slices 18 at work station 12, computer 25 actuates a compressed air source and transports slices 18 along the air track system 20 until the slices reach entrance air lock 26.

FIG. 2A shows a cutaway perspective view of the entrance air lock 26. Air lock 26 is composed of two sections, a top housing 42 and a bottom housing 44 which are hinged together. The entrance air lock serves two functions: (1) it serves to store a plurality of work pieces (for example, entrance air lock will hold 21 semiconductor silces) and (2) air lock 26 may be evacuated to a pressure which will match that of plasma reactor work station 14 (shown in FIG. 1). Referring to FIG. 3A entrance air lock 26 has an additional section of air track 46 which is parallel to and in line with the air track 20 outside of air lock 26. An entrance gate 48 is initially in the open position to allow slices 18 to pass through an entrance aperture 50 (FIGS. 2A and 2C) in the front of the bottom housing 44. In the open position, the top of entrance gate 48 is flush with the top of the air track system to allow the slices to pass thereover. Inside the entrance air lock, there are three capacitive sensors, 52, 52 and 56 (FIG. 3A), located on the surface of the air track system. As mentioned earlier, a compressed air source 58 supplies compressed air to the air track system 20 and apertures 24 to transport slices 18 between manufacturing stations. However, nitrogen source 60 supplies compressed nitrogen via line 62 to operate the air track system 46 within entrance air lock 26. When entrance gate 48 is open, purge valve 64 is open (thereby removing the vacuum) and valve 66 is closed so that a slightly positive pressure of nitrogen is supplied the inner chamber of entrance air lock 26 via supply line 68. With nitrogen filling the inner chamber of air lock 26, a "curtain of nitrogen" covers entrance aperture 50, thereby preventing impurities from entering the chamber and maintaining an ultraclean condition. As slice 18 moves from the external air track 20 into the input air lock 26, the compressed air in the external air track system 20 is applied continuously. However, as slice 18 reaches capacitive detector 52, the air track is disengaged from its continuous operation by computer 25 which senses the detector status. Computer 25 energizes the nitrogen source to provide a series of pulses of nitrogen gas to the air track system 46 in air lock 26 to position the slice over capacitive detector 54 and between the capacitive detectors 52 and 56, the preferred loading position. During the loading process, exit gate 70 is in the closed or up position. This isolates the pressure in plasma reactor 14 and interim chamber 38 from the atmospheric pressure in entrance air lock 26.

Referring again to FIG. 2A, magazine loader 72 allows a plurality of slices 74 to be loaded into the entrance air lock 26. Slice magazine holder 76 is comprised of two opposed rows of slots or channels 77 in which the edges of slices 74 are positioned by the air track. The sides 78 of loader 72 surround air track 46 (see FIGS. 2A and 3B) and fit into elongated holes 80 located in support plate 82. Air track 46 is indented at 84 in order to accomodate sides 78 of magazine loader 72. A drive shaft 86 passes through support member 82 and is connected to drive shaft motor 88. As the magazine loader 72 is loaded with slices, support member 82 is driven upwards by drive shaft 86 and motor 88 through elevation screw nut 90 (see FIG. 2B). Support plate 82 is moved through two guide bars 92 which have affixed thereto upper stop limits 94 and lower stop limits 96 to limit the motion of support plate 82 during the loading and unloading cycle of magazine loader 72.

In operation, the external air track 20 as well as the additional air track 46 (FIG. 3A) in entrance air lock 26 operate to load magazine loader 72. As each position in the magazine loader is filled, motor 88 (FIG. 2A) is actuated and drives the support plate 82 and magazine loader 72 up one position. The air track is again actuated and an additional slice is loaded into magazine loader 72. This process is continued until all of the slices 74 to be processed are positioned in magazine loader 72.

When magazine loader 72 is filled, solenoid valve 98 is acutated through linkage 100, thereby moving the entrance gate and closing the entrance aperture 50 (FIG. 2C). Referring to FIG. 2A, valve 66 is opened and purge valve 64 is closed thereby connecting the vacuum pump 59 to the interior chamber of entrance air lock 26 by way of line 68. The pressure in entrance air lock 26 is brought to a subatmospheric pressure which matches the subatmospheric pressure in plasma reactor work station 14 and interim chamber 38, for example 7.5 torr. When the two pressures are matched, solenoid valve 102 through linkage 104 opens exit gate 70 between the air lock 26 and the interim chamber 38. Valve 102 and exit gate 70 are only actuated and opened during the time period when reactor work station 14 is to be loaded with slices. FIGS. 2A and 3A show interim chamber 38 being comprised of a slide or movable air track 106 for transporting the plurality of slices 74 from chamber 26 to reactor work station 14. FIGS. 2A and 3A show slide 106 in the fully retracted position. In this position, slide 106 is completely enclosed in the housing of interim chamber 38. By actuating solenoid valve 108 (FIG. 2C) through linkage 110, slide 106 is moved to its fully extended position (also see FIG. 3B), passing through shield 112 (FIG. 2C). Slidable air track system 106 is composed of two parts, a stationary section 114 and a movable section 116 which is connected to linkage 110 (FIG. 2C). In the fully extended position, covers 118 cover the space remaining when movable portion 116 moves to its fully extended position. In this fully extended position shown in FIG. 2C, the slidable air track 106 is capable of transporting slices 74 from the magazine loader 72 into reactor work station 14. Shield 112 covers the opening between the inner chamber 38 and work station 14 when the movable air track 116 is in its retracted position (FIG. 2A). When movable air track 116 is extended, it pushes Shield 112 down to allow the track 116 to engage the substrate table 120. Shield 112 helps to prohibit gas from moving in and out of the chamber of station 14 and ensures a symmetrical atmosphere with no discontinuities for processing.

Figure 4:
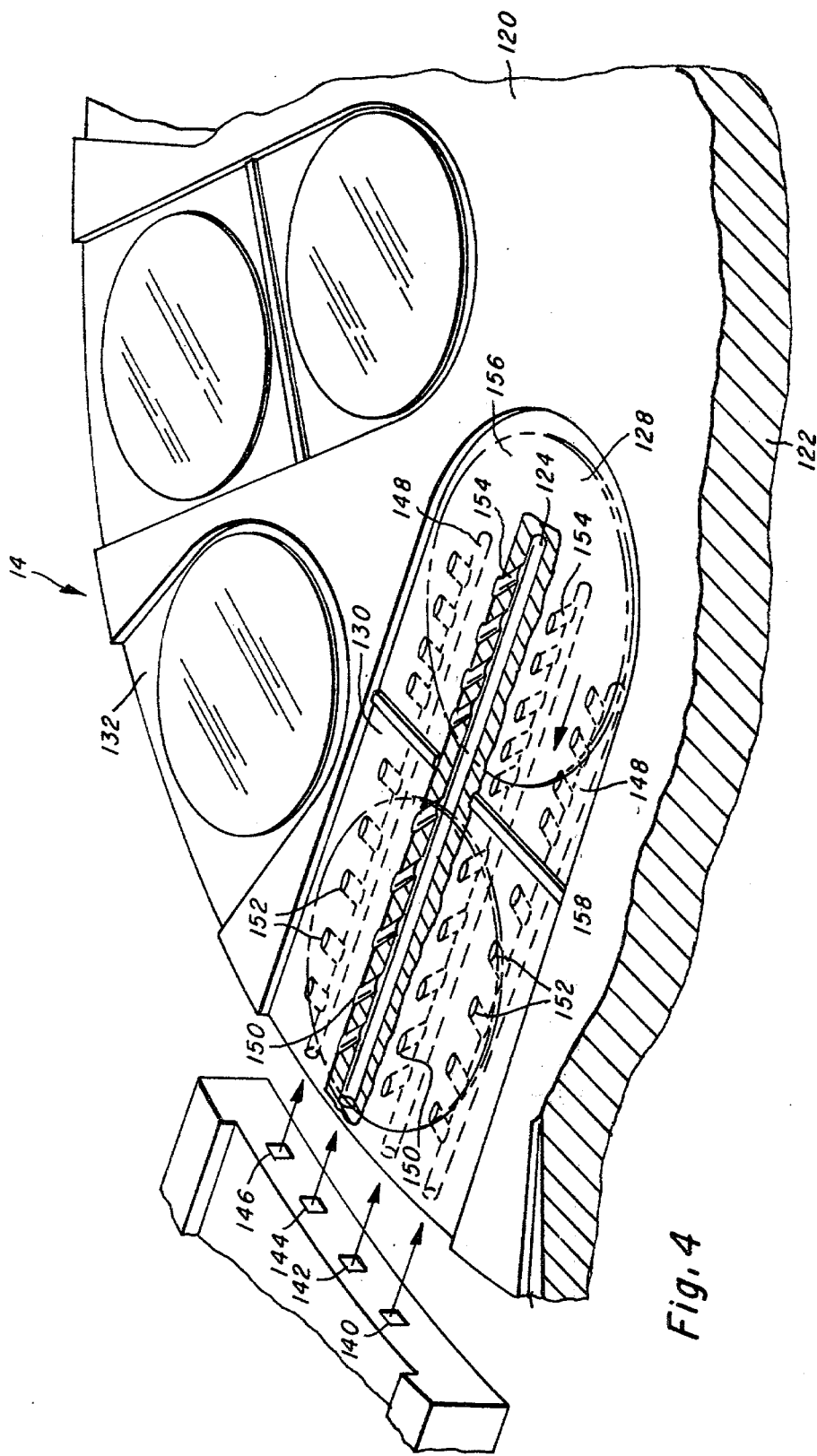
FIG. 4 is a cutaway perspective view of the air track and circular substrate holder table used in a manufacturing work station.

FIGS. 4 and 5 illustrate a more detailed view of the slice substrate holder or table 120 in reactor work station 14. The substrate table is comprised of three parts, a base section 122 (which has formed therein a plurailty of double and single slice positions 130 and 132, respectively, having grooves or cavities 140a–146a therein), a spacer plate 134 having apertures 136a–d which overlie grooves 140a–146a, respectively, and a third plate 128 which has four pair of grooves 124a–124d and corresponding holes 148–152 extending therethrough for producing slice supporting and transporting jets when a gas is passed through such holes. The base section 122 is of a generally circular configuration.

A pressurized fluid (nitrogen) through cavity 140 (pictured as an arrow from cavity 140) forces nitrogen through groove 140a (FIG. 5), through spacer holes 136a, through grooves 124a and holes 148. Pressurized nitrogen through cavity 142 forces nitrogen through groove 142a, through spacer holes 136b, through grooves 124b and holes 150. Pressurized nitrogen through cavity 144 forces nitrogen through groove 144a, spacer holes 136c, grooves 124c and holes 152. Pressurized nitrogen through cavity 146 forces nitrogen through cavity 146a, spacer holes 136d, grooves 124d and holes 154.

Therefore, to transport a slice to the inner position of the substrate holder 120 requires pressurized nitrogen to be applied to cavities 144 and 140 which would produce air jets from holes 152 and 148; this causes a slice to be transported to the position shown by slice 156 (FIG. 4). By applying pressurized nitrogen to cavity 144 only, an air jet will flow through holes 152 only, thereby transporting slice 158 to the position shown in FIG. 4. Two independent sets of light sources are located in the upper portion 30 (FIG. 1) of plasma reactor work station 14 and two corresponding sets of detectors are located below the substrate base 122. One set of sources and corresponding detectors is used when loading slices into the reactor system while the other set of sources and corresponding detectors is used when unloading the slices.

FIG. 5 illustrates light sources 160a–d and sensors 162a–d. When the slices 74 in air lock 26 are to be transferred to the substrate holder, nitrogen is initially applied to the air track system continuously until the slice interrupts the first light beams produced by light source 160a on the substrate table (FIG. 5). If the slice is to be loaded only in the outer substrate holder position (i.e., where slice 158 in FIG. 4 is positioned), the slice will stop at the locations of first sensor 162a and then the air track system will be pulsed intermittently with nitrogen until slice 158 no longer covers hole 170, thereby allowing light source 160a to impinge on detector 162a. When light from source 160a and 160c impinges upon detectors 162a and 162c and the light from source 160b is blocked by the slice from impinging upon detector 162b, then the slice is correctly positioned in the outer slice position. If the slice is to be transported to the inner slice position, then it is transported continuously until it covers holes 174 (and interrupts the light from source 160c). The air track system is then pulsed until the slice no longer covers hole 174 but covers hole 176, thereby allowing the light from source 160c to impinge on detector 162c and prevent light from source 160d from impinging on detector 162d. This condition assures proper placement of the slice in the inner slice position (where slice 156 is located in FIG. 4). Accordingly, pulsing of the air track system allows controlled placement and positioning of the slice.

The magazine loader 72 in air lock 26 (FIG. 2A) is successively lowered by motor 88 during the unloading procedure such that each successive slice engages the air track system for transport to the next substrate holder location. The substrate table 120 is sequentially rotated by motor 36 (FIG. 1) until each location in the substrate table is filled or the magazine loader 72 is empty. When the air lock 26 is emptied, exit gate solenoid valve 102 (FIG. 2C) is actuated through linkage 104 and the exit gate is closed. Additionally, valve 108 and linkage 110 (FIG. 2C) are actuated in order to move the slide member 106 back to its retracted position shown in FIG. 2A. Processing of the slices may then occur or the pressure may be reduced still further before the manufacturing steps are carried out. Some semiconductor processing steps require that the chamber in the plasma reactor 14 be less than 1 torr, for example, 0.7 torr.

Referring again to FIG. 1, after the processing step or steps have been completed in plasma reactor work station 14, the reverse process occurs to unload the slices through exit interim chamber 40 and exit air lock 28. Structurally, the entrance air lock 26 is essentially the same as exit air lock 28 and chamber 38 is essentially the same as interim exit chamber 40. One obvious difference would be that holes 24 located on the air track will be inclined at an angle and direction such as to support and transport the slices out of the plasma reactor 14. Nitrogen passing through holes 150 and 154 (FIG. 4) will support and transport the slices out of the plasma reactor 14. The entrance gate of the exit air lock is closed and the chamber pressure of the exit air lock 28 is brought to the same pressure as that of reactor work station 14, for example 7.5 torr. It has been experimentally determined that pressures of approximately 1.0 to 7.5 torr can be utilized during the loading and unloading cycle in that with pressures lower than that, it is difficult to control the movement of the slices and pulses of gas applied to the air track system cause overshoot and loss of control of the slices.

This pressure is dependent upon physical factors such as diameter of the holes, gas flow rates, pulse duration, etc. and can be modified as required. Once the pressure in exit air lock 28 matches that of the plasma reactor 14, the exit gate of the exit air lock opens, the movable slide is extended to the substrate holder and the slices are unloaded one at a time. As the magazine loader is loaded in the exit air lock, the magazine rises until the substrate table is unloaded. Upon completion of the loading process of the exit air lock, the exit gate is closed, the slidable air track is retracted and the interior of exit air lock 28 is then brought to atmospheric pressure. A high purity nitrogen atmosphere is utilized in the exit air lock in order to maintain ultraclean conditions. Upon reaching atmospheric pressure, the entrance gate is opened and the air track system removes the slices one at a time from the exit air lock. As each slice is unloaded, the magazine loader is successively lowered until it is empty.

Although the present invention has been shown and illustrated in terms of a specific method and apparatus, it will be apparent that changes or modifications can be made without departing from the spirit and scope of the invention as defined by the appended claims.

What is claimed is:

1. A work station for performing a manufacturing operation on an article comprising:
   a base having a recess therein at least as large as said article, said recess having a plurality of grooves therein;
   a spacer plate overlying said recess and having an aperture over each of said base plate grooves;
   a track insert plate overlying said spacer plate and having a plurality of grooves therein over each of said spacer apertures; and
   at least one slanted hole coupled through said track insert plate to each of said track insert plate grooves such that when gas is applied to selected base grooves, gas is transmitted through said slanted holes to move the article in said work station.

2. A work station according to claim 1 further including sensor means for detecting position of the article on said track insert plate.

3. A work station according to claim 2 wherein said sensor comprises a light source and detector on opposite sides of said base and track insert plate and said base, spacer plate and track insert plates each have holes that are in line for transmitting the light from said light source therethrough.

4. A work station according to claim 1 wherein said track insert plate comprises holes slanted in opposite direction to thereby move an article into and out of said work station.

5. A work station according to claim 1 further including a power source coupled to said base for moving said base during the loading and unloading cycle of said articles.

6. A work station according to claim 1 wherein at least one of said base recesses can accomodate at least two articles for performing a manufacturing operation.

7. A work station according to claim 1 wherein said base is generally circular.

8. A work station according to claim 7 wherein said recesses are alternately configured in said base plate to accomodate both one and two articles.

9. A work station according to claim 1 wherein said article is a semiconductor slice.

10. A work station according to claim 1 wherein said work station operates as a plasma reactor.

* * * * *